United States Patent [19]

Shin

[11] Patent Number: 5,665,643

[45] Date of Patent: Sep. 9, 1997

[54] MANUFACTURE OF PLANARIZED INSULATING LAYER

[75] Inventor: Daeshik Shin, Kawasaki, Japan

[73] Assignee: Fujitsu Limited, Kawasaki, Japan

[21] Appl. No.: 509,283

[22] Filed: Jul. 31, 1995

[30] Foreign Application Priority Data

Nov. 15, 1994 [JP] Japan ................................. 6-280619

[51] Int. Cl.$^6$ ................................................. H01L 21/44
[52] U.S. Cl. .......................... 438/763; 438/780; 438/624
[58] Field of Search ............................... 437/195, 194, 437/231, 235, 247

[56] References Cited

U.S. PATENT DOCUMENTS

| | | | |
|---|---|---|---|
| 4,103,045 | 7/1978 | Lesaicherre et al. | 427/82 |
| 4,826,733 | 5/1989 | Haluska et al. | |
| 5,310,720 | 5/1994 | Shin et al. | 437/231 |
| 5,436,083 | 7/1995 | Haluska et al. | |

FOREIGN PATENT DOCUMENTS

| | | |
|---|---|---|
| 4-320055 | 11/1992 | Japan . |
| 6-136130 | 5/1994 | Japan . |

OTHER PUBLICATIONS

Stanley Wolf, "Silicon Processing for the VLSI Era vol. 2" Lattice Press (Calif.) (1990) pp. 194–195 and 430–431.

*Primary Examiner*—John Niebling
*Assistant Examiner*—C. Everhart
*Attorney, Agent, or Firm*—Nikaido, Marmelstein, Murray & Oram LLP

[57] ABSTRACT

A method of manufacturing a semiconductor device having an insulating film includes the steps of: preparing a substrate having a step on a surface thereof; coating polysilazane on the surface of the substrate; and curing the polysilazane in a non-oxidizing atmosphere. Polysilazane coated on a substrate can be cured without corrosion and destruction of underlie wiring patterns.

22 Claims, 2 Drawing Sheets

MANUFACTURE OF PLANARIZED INSULATING LAYER

BACKGROUND OF THE INVENTION a) Field of the Invention

The present invention relates to manufacture of insulating films, and more particularly to a method of manufacturing semiconductor devices having planarized insulating films.

b) Description of the Related Art

Requests for high integration and high speed operation of semiconductor IC devices are increasing more and more. In order to highly integrate semiconductor elements and operate them at a high speed, it is necessary to layout a number of semiconductor elements in a small chip area and in some cases interconnect elements by multi-level wiring patterns by increasing the number of wiring layers. It is desired to narrow the width of each wiring pattern. However, a wiring pattern with a narrow width becomes higher than a wiring pattern with a broad width if both the wiring patterns should have the same resistance.

The surface of a chip having such multi-level wiring layers becomes extraordinarily irregular, so that not only the step coverage of a wiring layer formed thereover is degraded but also the precision of photolithography is lowered. Therefore, planarization technique plays a more important role in planarizing surfaces of underlie films such as an interlevel insulating film, prior to forming multi-level wiring layers thereon.

Reflow of glasses having a softening point lowered by additive impurities, such as phosphorous silicate glass (PSG), boron silicate glass (BSG), and boron phosphorous silicate glass (BPSG), is known as one of such insulating film planarization techniques. Glass reflow technique requires a relatively high temperature so that its use is restricted to some applications, and cannot be applied to semiconductor chips having wiring layers with low heat resistance such as Al or a highly precise impurity profile.

Lower temperature planarization technique has been desired. Silicon oxide film deposition technique by reacting tetraethoxy silane (TEOS) with ozone, can be used at a relatively low temperature and has a self-planarization function of reducing steps of the surface of an underlie layer. Although a region between convexities having a relatively narrow span can be efficiently filled with an ozone-TEOS oxide film, the planarization performance is lowered at a region between convexities having a wider span.

A spin-on-glass (SOG) silicon oxide film can be formed by spin-coating liquid phase silicon compound such as polysilazane at a room temperature and curing it. This method has a good planarization performance because of use of liquid phase silicon compound.

It is difficult to sufficiently planarize a stepped surface of a substrate by an ozone-TEOS oxide film, if convexities formed by a wiring pattern or other patterns have a broad span.

In forming a silicon oxide film through SOG, polysilazane is spin-coated on the surface of a substrate, and then is cured in an aqueous (water) vapor atmosphere to replace N atoms of silazane bonds in polymer with O atoms. During curing in an aqueous vapor atmosphere, water contents permeate into wiring patterns under the SOG film so that the patterns become easy to be corroded; In addition, rapid replacement of N atoms with O atoms generates heat. Although this heat does not corrode wiring patterns, the patterns may be destroyed and locally narrowed. A current density at a narrowed wiring pattern increases, and electromigration becomes likely to occur. If destruction is large, the wiring pattern may be broken away.

SUMMARY OF THE INVENTION

It is an object of the present invention to provide a method of manufacturing a semiconductor device having an insulating film which is formed by curing polysilazane coated on a substrate without corrosion and destruction of underlie wiring patterns.

According to one aspect of the present invention, there is provided a method of manufacturing a semiconductor device including the steps of: preparing a substrate having a step on a surface thereof; coating polysilazane on the surface of the substrate; and curing the polysilazane in a non-oxidizing atmosphere.

The step of preparing a substrate having a step on a surface thereof may include the steps of: preparing a substrate having an insulating surface; and forming a wiring pattern on the insulating surface.

The method may further include the step of depositing an insulating film on the surface of the substrate by CVD, after the step of forming a substrate having a step on a surface thereof and before the step of coating the polysilazane.

The method may further include the step of depositing a silicon oxide film on the insulating film by using tetraethylorthosilicate as a source material, after the step of depositing an insulating film by CVD and before the step of coating said polysilazane.

If polysilazane is cured in a non-oxidizing atmosphere, rapid replacement reaction of N atoms of silazane bonds with O atoms will not occur. Therefore, heat generation by replacement reaction of N atoms with O atoms can be suppressed.

Curing polysilazane in a non-oxidizing atmosphere can prevent breakages and destructions from being formed in wiring patterns formed on the underlie layer surface. Since water is not contained in the curing atmosphere, corrosion of wiring patterns can be prevented.

An insulating film formed by curing polysilazane has an insulating performance inferior to an $SiO_2$ film formed by CVD. If an insulating film is formed to cover the surfaces of wiring patterns and their underlie layer and thereafter polysilazane is coated thereon, an insulating performance between wiring layers can be improved.

An oxide film deposited by CVD by using tetraethoxy silane (TEOS) and ozone has a self-planarization function. If an oxide film is formed by using TEOS prior to coating polysilazane, some concavities may be filled with this film. It is effective that TEOS is filled in some concavities on the substrate surface, particularly concavities with narrow widths. Therefore, the surface coated with polysilazane can be planarized more.

As above, it is possible to form an interlevel insulating film having a flat surface without forming any breakage and destruction of wiring patterns formed on an underlie layer. Since the surface can be planarized, the step coverage of a higher level wiring pattern formed on the interlevel insulating film can be improved. It is also possible to easily planarize the surface of layers formed at the later process and to easily form via holes or the like.

DETAILED DESCRIPTION OF THE PREFERRED EMBODIMENTS

An embodiment of the invention will be described with reference to FIGS. 1A and 1B by using as a specific example the formation of an interlevel insulating film for covering a first level wiring pattern formed on an insulating film over MOSFETs.

Figure 1A:
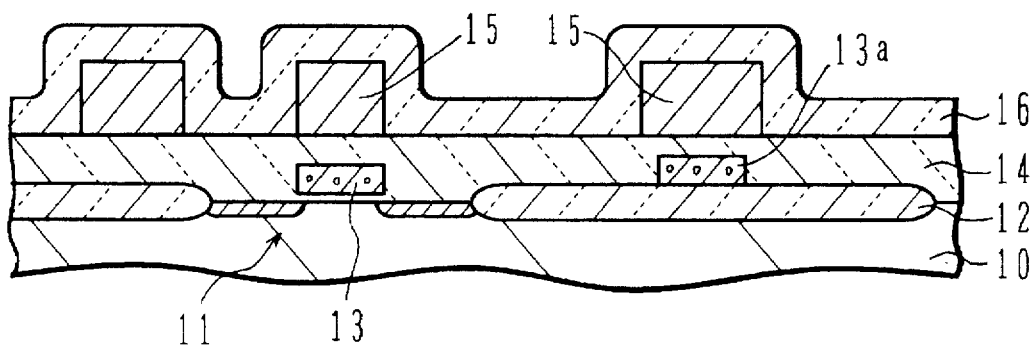
FIGS. 1A to 1C are cross sectional views of a substrate illustrating a method of manufacturing a semiconductor device according to an embodiment of the invention.
Figure 1B:
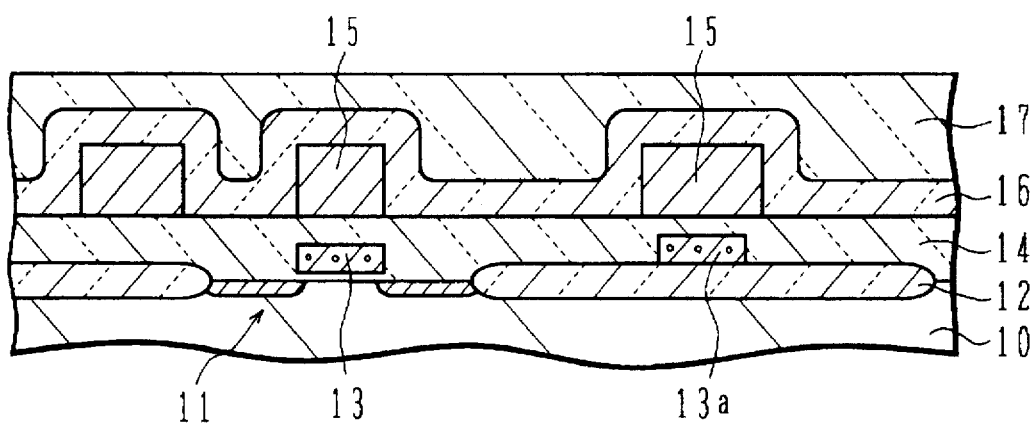

FIGS. 1A and 1B illustrate a method of manufacturing a semiconductor device according to the embodiment of the invention. Referring to FIG. 1A, a field oxide film 12 is formed in a surface of a silicon substrate 10 by local oxidation of silicon (LOCOS), surrounding active regions 11 of the substrate 10. After the field oxide film 12 is formed, the nitride film used as a mask for selective oxidation and the oxide film under the nitride film are removed and a thin gate oxide film is formed on the active region by thermal oxidation.

Thereafter, a polycrystalline silicon layer is deposited on the substrate surface and patterned by photolithography to form a gate electrode 13 and a gate wiring pattern 13a. The gate may also be made of polycide which is a laminate of a polycrystalline silicon layer and a silicide layer. Ions are implanted to form source/drain regions of MOSFETs, resistor regions, and the like. After forming these active and passive elements, a boron phosphorous silicate glass (BPSG) film 14 is deposited to a thickness of about 500 nm, covering the gate electrode 13 and gate wiring pattern 13a. This BPSG film 14 is formed by CVD at a temperature of about 380° C. under an atmospheric pressure, by using, for example, $SiH_4$, $O_2$, $B_2H_6$, and $PH_3$ as source gases and $N_2$ as diluting gas. The BPSG film 14 is reflowed to planarize it. The BPSG film 14 functions as an interlevel insulating film between the gate/gate wiring pattern 13, 13a and a higher level wiring pattern.

Al alloy containing 1% of Si is sputtered on the BPSG film 14 to a thickness of about 700 nm to form an Al alloy layer which is then patterned by photolithography to form an Al wiring patterns 15. Patterning the Al alloy layer forms concavities and convexities having a depth or height of about 700 nm on the substrate surface.

A silicon oxide film 16 is deposited to a thickness of about 500 nm by plasma CVD at a substrate temperature of about 300° C. by using $SiH_4$ and $N_2O$ as source gases to cover the underlie wiring patterns 15. This silicon oxide film 16 is formed conformal to the topology of the surface of the underlie layer. The silicon oxide film 16 is thinner on a side wall than on a flat surface. If an aspect ratio of a concavity between Al wiring patterns 15 is 1 or smaller, adjacent side walls of the silicon oxide film 16 will not contact each other. Therefore, a silicon oxide film of good quality can be formed without forming any void therein.

As shown in FIG. 1B, polysilazane is coated to a thickness of 500 nm and subjected to a heat treatment for three minutes at a temperature of 200° C. in an $N_2$ atmosphere. This thickness is not precise because it varies according to locations. It is sufficient if polysilazane fills concavities and covers the substrate surface. Thereafter, it is cured for 30 minutes at a temperature of 450° C. in an $N_2$ atmosphere.

The interlevel insulating film 17 formed under the above conditions has generally a flat surface as shown in FIG. 1B. Here, "generally" means there may be some tolerance in flatness. For example, when a substrate is warped, the surface of the insulating film formed from polysilazane will also be warped. There may also be some chamferring at the edge. Since aqueous vapor is not contained in the curing atmosphere, the Al wiring pattern 15 will not be corroded and destroyed.

Figure 1C:
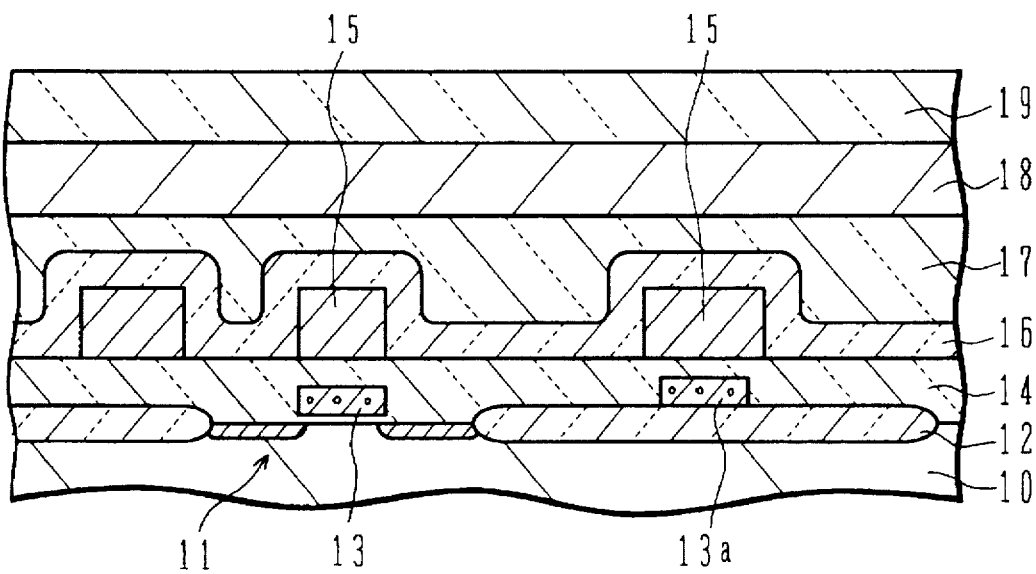

As shown in FIG. 1C, an upper level wiring 18 is formed, similar to the wiring 15, on the planarized insulating layer 17. Another insulating layer 19 is formed thereon similar to the layer 16, to complete the two level wirings. Contact holes or via holes are formed in the interlevel insulating layers for making electrical connection among the wiring layers and the conductive regions in the substrate. A cap insulator layer may also be formed. Further wiring layers may also be made after planarizing the underlie surface as described above.

Next, another embodiment will be described which confirms the effects of curing polysilazane in an $N_2$ atmosphere.

Figure 2:
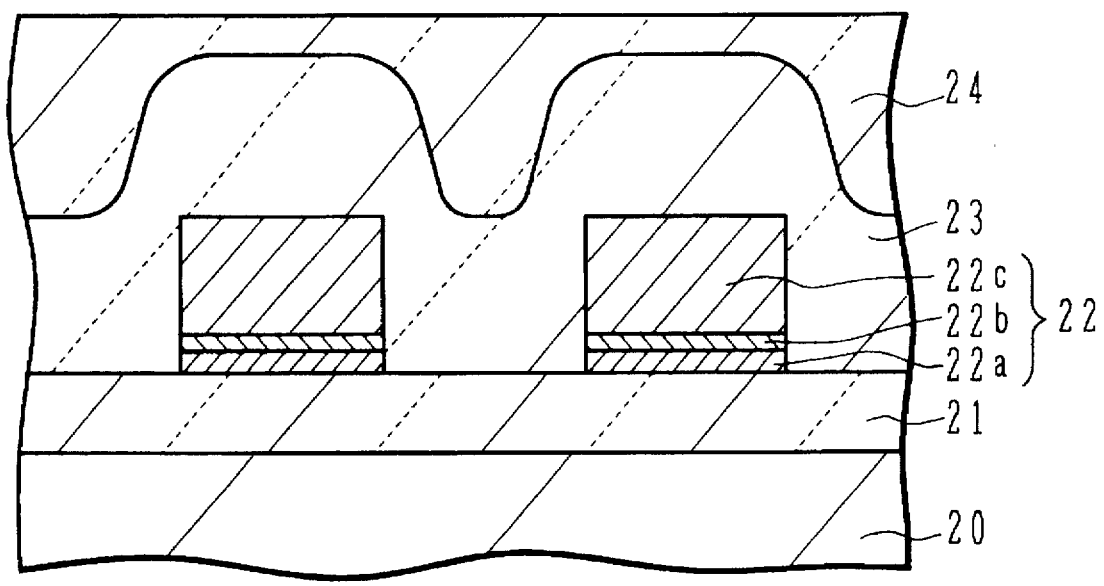
FIG. 2 is a cross sectional view of a substrate used by another embodiment of the semiconductor device manufacturing method.

FIG. 2 is a cross sectional view of a substrate used by this embodiment. A BPSG film 21 is formed on a silicon substrate 20. On the BPSG film 21, a 20 nm thick Ti layer, a 150 nm thick TiN layer, a 700 nm thick Al alloy layer of AlCuTi, and a 15 nm thick Si layer are formed in this order. The Ti layer and TiN layer function as a barrier metal layer, and the Si layer functions as an antireflection layer.

The layers from the Ti layer to Si layer are patterned by photolithography to form a stripe line-and-space pattern having wiring patterns of straight lines disposed at an equal pitch. The uppermost Si layer is etched to form wiring patterns 22 of a laminate structure including the Ti layer 22a, TiN layer 22b, and Al alloy layer 22c. A ratio of the line width to the space width of the line-and-space pattern is 1:1. Five substrates with the line widths of 0.7 µm, 1.0 µm, 2.0 µm, 4.0 µm, and 8.0 µm were prepared.

An SiON film 23 covering the wiring patterns 22 is deposited to a thickness of 800 nm by plasma CVD at a substrate temperature of 350° C. The SiON film 23 is deposited conformal to the surface of the underlie layer as shown in FIG. 2.

Polysilazane is coated on the SiON film 22 to a thickness of about 500 nm by using a spin coater. After spin-coating, baking is performed by using a hot plate in an $N_2$ atmosphere. A baking temperature is in the range of 250° to 300° C. and a baking time is 2 to 5 minutes. Next, the substrate is placed in a vertical electric furnace and cured for 30 minutes at a temperature of 450° C. while $N_2$ gas is flowed at a flow rate of 10,000 sccm. The vertical electric furnace used can process fifty 6-inch wafers in batch.

Since polysilazane is liquid, coated polysilazane is filled in concavities on the substrate surface. The coated and cured polysilazane forms an interlevel insulating film 24 having generally a flat surface. After the interlevel insulating film was formed under the above conditions, any destruction and breakage of the wiring patterns 22 were not found.

With generally the same processes, the wiring patterns 22 and SiON film 23 were formed, and polysilazane was coated and cured in a dry $O_2$ atmosphere. In this case, for the wiring patterns having a line width of 0.7 µm, a number of breakages (open-circuit) were found. A number of destructions of the wiring patterns having a line width of 1.0 to 4.0 µm were found although no breakage was found. No destruction was found for the wiring patterns having a line width of 8.0 µm. Planarization with polysilazane utilizing curing in an oxidizing atmosphere can be regarded to pose some acute problem if wiring patterns have spaces of 1 µm or narrower.

It can be understood from the above experiments that if polysilazane is cured in an $N_2$ atmosphere, breakage and destruction of wiring patterns formed on the surface of the underlie layer can be prevented. The preventive effects are distinctive particularly for wiring patterns having a space of 1 μm or narrower. If polysilazane is cured in an O₂ atmosphere, N atoms of silazane bonds is rapidly replaced by O atoms, and this reaction generates heat. However, if polysilazane is cured in an N₂ atmosphere, replacement reaction of N atoms with O atoms can be suppressed. No destruction of wiring patterns is considered to occur due to suppression of heat generation by rapid replacement reaction.

Wiring patterns will not be corroded because water is not contained in a curing atmosphere.

In the above embodiments, polysilazane is cured in an N₂ atmosphere. Even in other non-oxidizing atmospheres, rapid replacement reaction of N atoms with O atoms can be suppressed so that it can be considered that the same effects are obtained. For example, polysilazane was cured for 30 minutes at a temperature of 380° C. by using the previously described vertical electric furnace while NH₃ gas was flowed at a flow rate of 6,000 sccm. No destruction was found also in this case. The same effects may be expected if polysilazane is cured in an inert gas atmosphere such as Ar gas. In other words, polysilazane may be cured in a non-oxidizing atmosphere.

In any case, it is preferable to remove water in a curing atmosphere as much as possible. It is desired to make water vapor content in an atmosphere to be less than 1 volume and more preferably less than 0.01 volume %.

In the above embodiments, a curing temperature is set to 380° or 450° C. Other temperatures may be used. For example, the temperature may be set in the range of 350° to 550° C., with good results being expected.

Polysilazane used in the above embodiments is expressed by the following chemical formula, and has n=several thousands. Polysilazane with n in the range of 50 to 500,000 may provide expected good results.

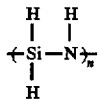

Polysilazane of a ring structure can be easily oxidized and is chemically unstable so that it is not very suitable for forming an interlevel insulating film. In the second embodiment, polysilazane of a chain (or ladder) structure obtained by opening a ring of cyclopolysilazane was used. Even if opening a ring is insufficient and cyclopolysilazane is left, there is no problem so long as the amount of left cyclopolysilazane is small. Such amount of chain (or ladder) polysilazane may be expressed as "consisting essentially of".

In the second embodiment, an SiON film is formed by plasma CVD, covering the surfaces of wiring patterns and their underlie layer, and thereafter polysilazane is coated on the SiON film. Insulating films other the plasma CVD SiON film may also be used. This SiON film is used for improving the characteristics of insulation between wiring layers. It is therefore desired to form an insulating film having good insulation characteristics prior to coating polysilazane.

For example, an SiO₂ film made by electron cyclotron resonance (ECR) plasma CVD, a TEOS film by plasma CVD, or other films may be formed. A TEOS film by plasma CVD may be laminated upon an SiO₂ film by ECR plasma CVD. Since a TEOS film has a self-planarization function, some concavities may be filled with this film before polysilazane is coated. It is effective in the point that TEOS is filled in concavities, particularly concavities with narrow widths, and planarizes its surface.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A method of manufacturing a semiconductor device comprising the steps of:
   preparing a semiconductor substrate having a stepped surface thereupon;
   coating polysilazane on the stepped surface of the substrate; and
   curing said polysilazane in a non-oxidizing atmosphere to form an interlevel insulating film having a planarized surface,
   wherein said polysilazane has a chemical formula

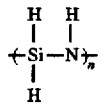

where n is several thousands.

2. A method according to claim 1, wherein said non-oxidizing atmosphere has a water vapor content of 1 volume % or smaller.

3. A method according to claim 1, wherein said polysilazane has a chain structure or a ladder structure formed by opening a ring of cyclopolysilazane.

4. A method according to claim 1, wherein said non-oxidizing atmosphere is a nitrogen atmosphere or an ammonia atmosphere.

5. A method according to claim 3, wherein said step of preparing a semiconductor substrate having a step on a surface thereof includes the steps of:
   preparing a semiconductor substrate having an insulating surface; and
   forming a plurality of wiring patterns with a space between adjacent wiring patterns on the insulating surface.

6. A method according to claim 5, wherein the space between said adjacent wiring patterns is 1 μm or narrower.

7. A method according to claim 1, further comprising the step of forming an insulating film on the surface of the substrate by chemical vapor deposition (CVD), after said step of forming a substrate having a step on a surface thereof and before said step of coating said polysilazane.

8. A method according to claim 7, wherein said insulating film is made of silicon oxide or silicon oxynitride.

9. A method according to claim 7, further comprising the step of depositing a silicon oxide film on said insulating film by using tetraethylorthosilicate as a source material, after said step of depositing an insulating film by CVD and before said step of coating said polysilazane.

10. A method according to claim 1, wherein said step of curing said polysilazane cures at a temperature range of 350° to 550° C.

11. A method according to claim 3, wherein said step of curing said polysilazane cures at a temperature range of 380° to 450° C.

12. A method according to claim 1, wherein said step of curing said polysilazane cures at a temperature range of 350° to 550° C.

13. A method according to claim 6, wherein said step of curing said polysilazane cures at a temperature range of 380° to 450° C.

14. A method according to claim 4, wherein said step of curing said polysilazane cures at a temperature range of 350° to 550° C.

15. A method of manufacturing a semiconductor device comprising the steps of:
 forming a field oxide film on a surface of a silicon substrate, the silicon substrate having a stepped surface the field oxide film defining active regions;
 forming insulating gate structure on the surface of the substrate, the gate structure including gate electrode on the active region and gate wiring on the field oxide film;
 depositing a first silicon oxide film on the substrate;
 reflowing said first silicon oxide film;
 forming a first wiring including adjacent lines with a space therebetween of no more than 1 μm on the reflowed silicon oxide film;
 forming a second silicon oxide film on the first wiring and the first silicon oxide film;
 coating polysilazane of a degree of polymerization of several thousands formed by opening a ring of cyclopolysilazane, on the second silicon oxide film; and
 curing said polysilazane in a non-oxidizing atmosphere to form an interlevel insulating film having a planarized surface.

16. A method according to claim 15, wherein said gate electrode and gate wiring comprise polycrystalline silicon.

17. A method according to claim 15, wherein said first wiring comprises aluminum or aluminum alloy.

18. A method according to claim 15, wherein said non-oxidizing atmosphere comprises nitrogen or $NH_3$ and contain less than 1 volume % of water vapor.

19. A method according to claim 15, wherein said step of curing said polysilazane cures at a temperature range of 380° to 450° C.

20. A method of manufacturing a semiconductor device comprising the steps of:
 opening a ring of cyclopolysilazane to provide polysilazane of a chain structure or a ladder structure;
 preparing a semiconductor substrate having a step on a surface thereof;
 coating said polysilazane on the surface of the substrate; and
 curing said polysilazane in a non-oxidizing atmosphere, at a temperature in a range of 350° to 550° C. to form an interlevel insulating film having a planarized surface.

21. A method according to claim 20, wherein said substrate has parallel wiring patterns with a space of 1 μm or less.

22. A method according to claim 21, wherein degree of polymerization of said polysilazane is several thousands.

* * * * *